(12) United States Patent
Ko

(10) Patent No.: US 11,018,322 B2
(45) Date of Patent: May 25, 2021

(54) LIGHT EMITTING DEVICE USING LIGHT EMITTING DIODE

(71) Applicant: LG Display Co., Ltd., Seoul (KR)

(72) Inventor: Sung-Wook Ko, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 76 days.

(21) Appl. No.: 16/550,100

(22) Filed: Aug. 23, 2019

(65) Prior Publication Data

US 2020/0203664 A1 Jun. 25, 2020

(30) Foreign Application Priority Data

Dec. 21, 2018 (KR) .......................... 10-2018-0167101

(51) Int. Cl.
*H01L 51/52* (2006.01)

(52) U.S. Cl.
CPC .......... *H01L 51/5268* (2013.01); *H01L 51/52* (2013.01); *H01L 51/5212* (2013.01)

(58) Field of Classification Search
CPC .. H01L 51/5268; H01L 51/52; H01L 51/5212
See application file for complete search history.

(56) References Cited

U.S. PATENT DOCUMENTS

| | | | | |
|---|---|---|---|---|
| 2007/0228385 | A1* | 10/2007 | Cao | H01L 33/32 257/79 |
| 2013/0161669 | A1* | 6/2013 | Chen | H01L 33/145 257/98 |
| 2013/0175568 | A1* | 7/2013 | Uenishi | H01L 33/007 257/98 |
| 2015/0144900 | A1* | 5/2015 | Lee | H01L 51/5262 257/40 |
| 2017/0131439 | A1* | 5/2017 | Kobori | G02B 1/118 |
| 2019/0252576 | A1* | 8/2019 | Lee | H01L 27/156 |

FOREIGN PATENT DOCUMENTS

KR 10-2005-0105214 A 11/2005

\* cited by examiner

*Primary Examiner* — Marc Anthony Armand
(74) *Attorney, Agent, or Firm* — Polsinelli PC

(57) ABSTRACT

A light emitting device comprises an emission area and a non-emission area defined at a substrate, wherein the non-emission area includes a first non-emission area and a second non-emission area where a first pad and a second pad are respectively disposed; a light emitting diode disposed over the substrate and including a first electrode, an emission layer and a second electrode; an auxiliary electrode directly contacting the first electrode; a buffer layer disposed between the substrate and the light emitting diode; and a light extraction layer disposed between the buffer layer and the substrate, wherein the first electrode includes a contact portion directly contacting the auxiliary electrode, an electrode portion disposed in the emission area and a short-circuit-preventing portion disposed between the contact portion and the electrode portion.

22 Claims, 7 Drawing Sheets

LIGHT EMITTING DEVICE USING LIGHT EMITTING DIODE

CROSS REFERENCE TO RELATED APPLICATION

This application claims the benefit of Korean Patent Application No. 10-2018-0167101 filed on Dec. 21, 2018, which is hereby incorporated by reference in its entirety.

BACKGROUND

Field of the Disclosure

The present disclosure relates to a light emitting device, and more specifically, to a light emitting device that can enhance out-coupling efficiency and encapsulation property.

Description of the Background

As electronics and information technologies have been advanced, various technologies such as display and illumination field for processing large amount of information have been rapidly developing. Various flat panel display devices replacing a conventional cathode ray tube (CRT) have been developed. Among the flat panel display devices, an organic light emitting diode (OLED) display device capable of fabricating a thin structure and being low power consumption has attracted a lot of attention as a next-generation display device that can replace a liquid crystal display device (LCD).

Most lights emitted from the light emitting element in a light emitting device utilizing a light emitting diode cannot be emitted outwardly. For example, the light emitted outside the substrate in the conventional OLED is only about 20% of the total light emitted from the light emitting element, resulting in poor out-coupling efficiency. In addition, the light emitting diode including the OLED is vulnerable to an external environment such as external moisture or oxygen, and the function of the light emitting diode is deteriorated due to the external moisture and oxygen.

SUMMARY

Accordingly, the present disclosure is directed to a light emitting device that substantially obviates one or more of the problems due to the limitations and disadvantages of the prior art.

The present disclosure is to provide a light emitting device that enhances its out-coupling efficiency, and thereby improving its luminous efficiency.

The present disclosure is to provide a light emitting device that can minimize a dysfunction of a light emitting device and buffer layer by infiltration of external impurities.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

The present disclosure provide a light emitting device that comprises a substrate including an emission area and an non-emission area, a light emitting diode disposed over the substrate and including a first electrode, an emission layer and a second electrode, an auxiliary electrode in physically contact with the first electrode, a buffer layer disposed between the substrate and the light emitting diode and a light extraction layer disposed between the buffer layer and the substrate, wherein the substrate includes a compound in which silicon (Si) atom is chemically bonded to a metal atom selected from the group consisting of titanium (Ti), zirconium (Zr), hafnium (Hf), zinc (Zn), tellurium (Te) and combination thereof, and herein the first electrode includes a contact portion in physically contact with the auxiliary electrode, an electrode portion disposed in the emission area and a short-circuit-preventing portion disposed between the contact portion and the electrode portion.

The short-circuit-preventing portion may have a smaller line width than at least one of the contact portion and the electrode portion.

The light emitting device may further comprises a bank layer disposed on the first electrode and defining the emission area of the emission layer, and wherein the auxiliary electrode may be in contact with the first electrode on the first electrode and arranged along the bank layer.

As an example, the bank covers an upper surface and a side surface of each of the contact portion and the short-circuit-preventing portion, and the bank layer covers a side surface of the electrode portion.

The light emitting device may further comprise at least one pad disposed at the non-emission area.

In one exemplary aspect, the buffer layer and the light extraction area may be disposed on an area corresponding to the emission area and may not be disposed on the non-emission area. In this case, the first electrode may extend along an outer side of the buffer layer and the light extraction layer.

As an example, the light extraction layer may include an inorganic particle.

In an alternative aspect, the light emitting device may further comprise a planarization layer disposed between the buffer layer and the light extraction layer. As an example, the planarization layer may include an inorganic material selected from the group consisting of inorganic nitride, inorganic oxide, inorganic oxynitirde and combination thereof and/or an organic material selected from the group consisting of acrylate-based resin, polyimide-based resin and combination thereof.

As an example, the silicon atom and the metal atom in the substrate may be mixed with a molar ratio between about 7:3 and about 3:7.

The substrate may have a reflective index between about 1.7 and about 2.3.

For example, the metal atom may include titanium.

The buffer layer may include at least one material of an inorganic material selected from the group consisting of silicon nitride ($Si_xN_y$), silicon oxynitride ($Si_xO_yN_z$), silicon oxide ($Si_xO_y$), zinc oxide (ZnO) and combination thereof and a photo-acrylic compound.

The silicon atom and the metal atom are bonded through oxane linkage (—O—).

An interface between the substrate and the light extraction layer may include a curved surface.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain the principles of aspects of the disclosure.

In the drawings.

DETAILED DESCRIPTION

Reference will now be made in detail to aspects of the disclosure, examples of which are illustrated in the accompanying drawings.

Figure 1:
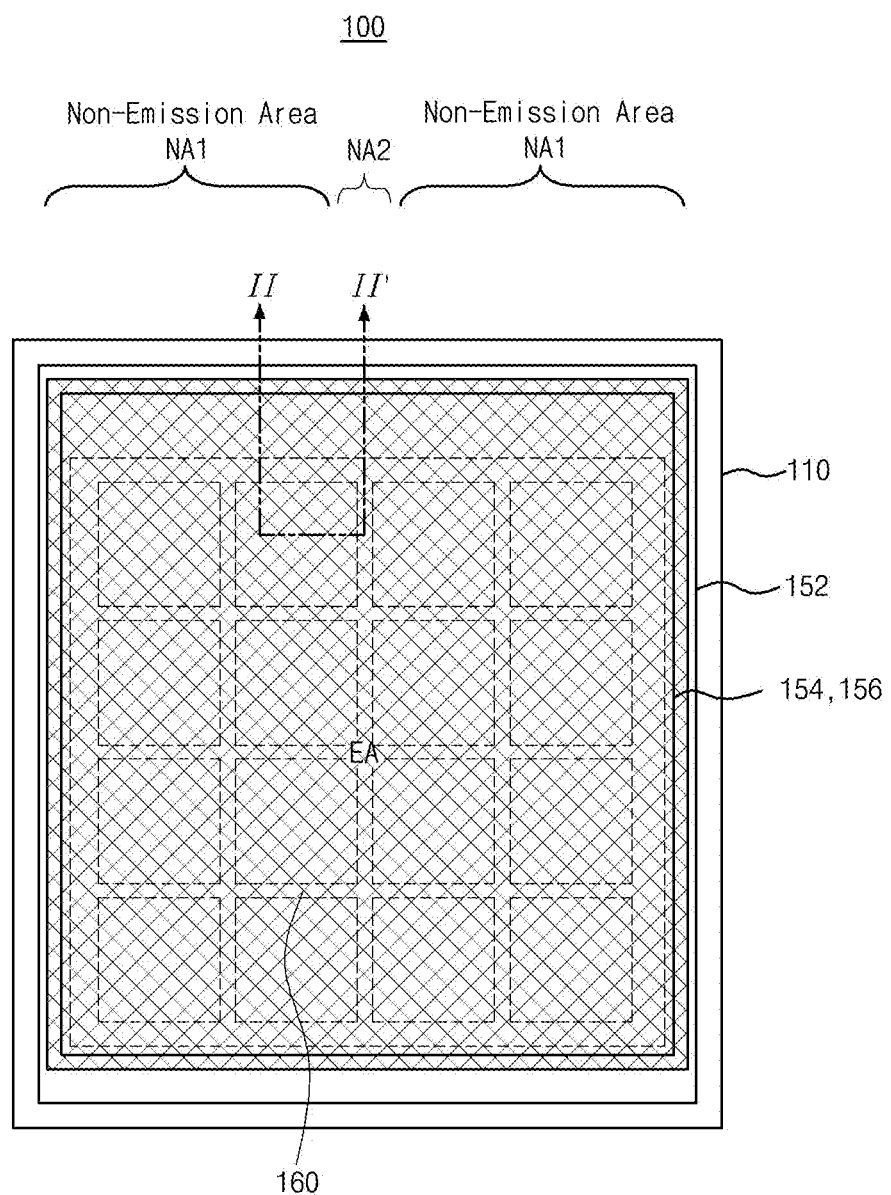
FIG. 1 is a schematic top view illustrating a light emitting device in accordance with an exemplary aspect of the present disclosure.

FIG. 1 is a schematic top view illustrating a light emitting device in accordance with an exemplary aspect of the present disclosure. As illustrated in FIG. 1, a light emitting device 100 includes a substrate 110 that defines an emission area "EA", which substantially illuminates and emits lights outwardly, and non-emission areas "NA1" and "NA2", each of which is disposed along an outer periphery of the emission area "EA". A light emitting diode 150 (shown in FIG. 2) is disposed over the substrate 110.

The light emitting diode 150 includes first and second electrodes 152 and 156, each of which is disposed over an entire surface of the substrate 110, and an emission layer 154 as an emitting unit disposed between the first and second electrodes 152 and 156, to form a light emitting element. As electrical signals are applied into the first and second electrodes 152 and 156, the emission layer 154 illuminate and emit light toward the entire substrate 110.

An auxiliary electrode 160, which is in physically contact with the first electrode and may have a matrix shape, is disposed on a part of the emission area "EA" and the non-emission areas "NA1" and "NA2" defined in the substrate 110. The auxiliary electrode 160 may be formed a highly conductive metal so as to apply a uniform voltage into the first electrode 152 within the whole emission area "EA". As a result, the large-area light emitting device 100 can implement light emission having uniform luminance over the whole emission area "EA".

The emission layer 154 includes luminous materials emitting white (W) color light. As an example, the emission layer 154 may include a red (R) emission layer, a green (G) emission layer and a blue (B) emission layer. Alternatively, the emission layer 154 may have a tandem structure including a blue (B) emission layer and a yellow green (YG) or red green (RG) emission layer. However, the emission layer 154 is not limited to the above-described structures and may include other structures.

At least one pad 172 and 174 is disposed over the substrate 110 in the non-emission areas "NA1" and "NA2". As an example, a first pad 172 is disposed over the substrate 110 in the first non-emission area "NA1" and a second pad 174 is disposed over the substrate 110 in the second non-emission area "NA2".

Each of the first and second pads 172 and 174 provides a driving signal from a driving integrated circuit (not shown) to one of the first and second electrodes 152 and 156, respectively. In other words, each of the first and second pads 172 and 174 is electrically connected to external signal source to apply voltages to each of the first and second electrodes 152 and 156, respectively. While not shown in FIGS. 1 and 2, each of the first and second pads 172 and 174 may further comprises a pad lower electrode including the same material as the first electrode 152 and a pad upper electrode which is disposed on the pad lower electrode and has a line width narrower than the pad lower electrode.

The pad upper electrode (not shown) may include the same material as the auxiliary electrode 160 so as to reduce an electrical resistance of the pad lower electrode (not shown). In addition, a pad passivation layer (not shown) covering a side surface and an upper surface of the pad upper electrode (not shown) may be disposed in the non-emission areas "NA1" and "NA2". The pad passivation layer (not shown) is made of the same material as a bank layer 158 (shown in FIG. 3) so as to minimize a corrosion of the pad upper electrode (not shown) by external moisture and the like.

Figure 2:
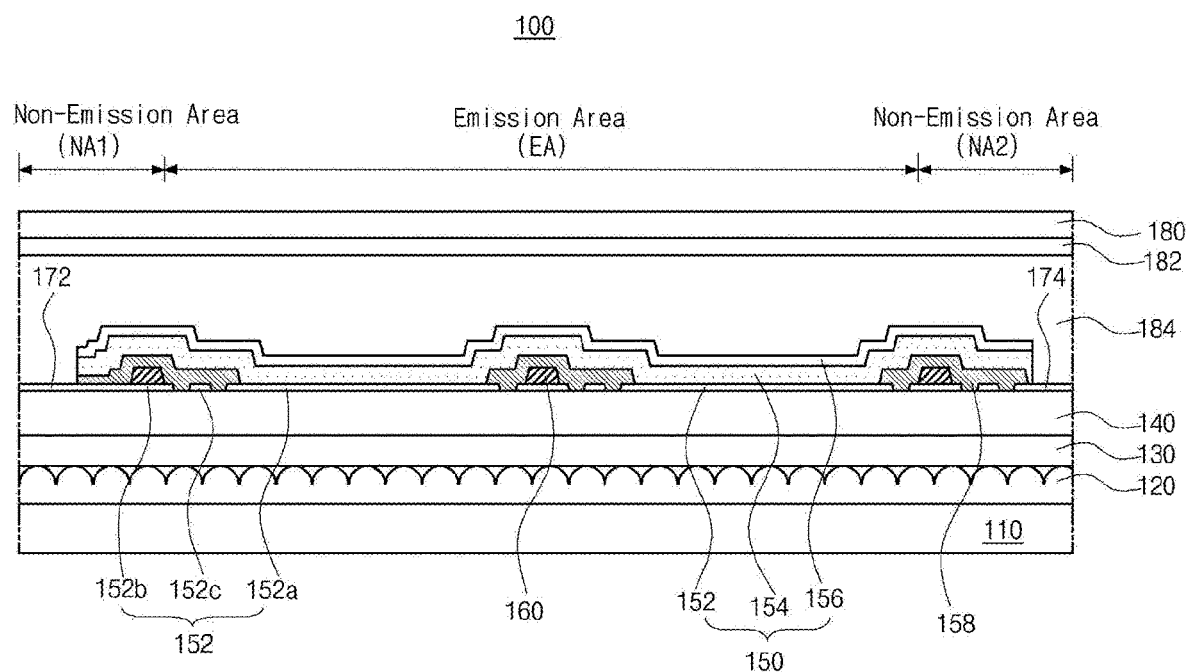
FIG. 2 is a schematic cross-sectional view illustrating a light emitting device taken along line II-II' in FIG. 1.
Figure 3:
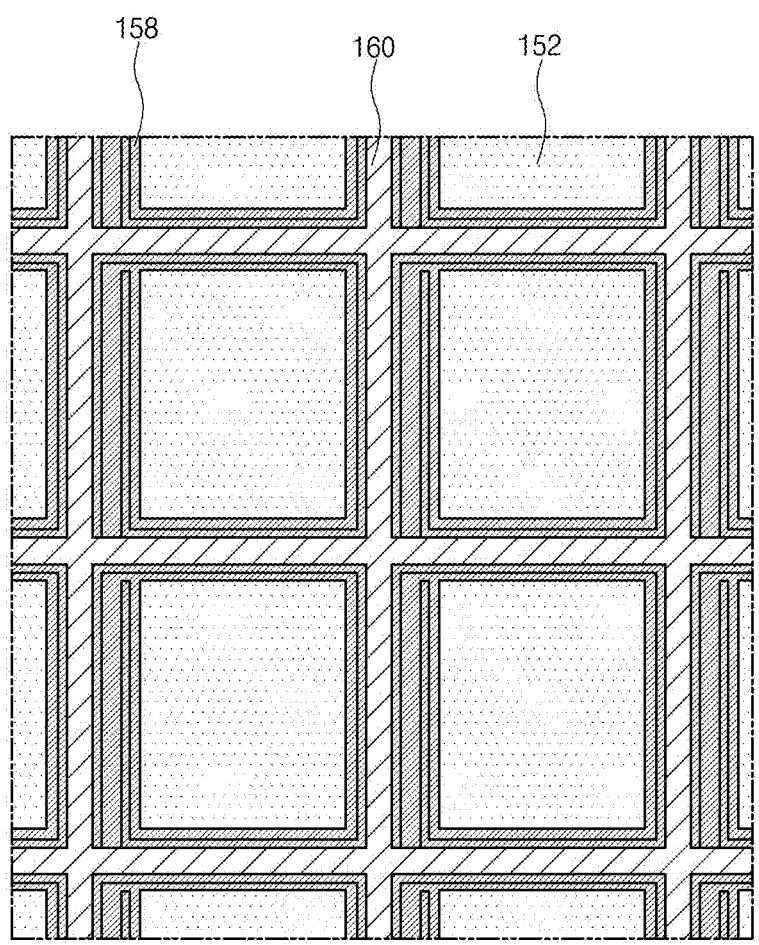
FIG. 3 is an enlarged top view illustrating an area disposing a first electrode and an auxiliary electrode in the light emitting device in FIG. 1.
Figure 4:
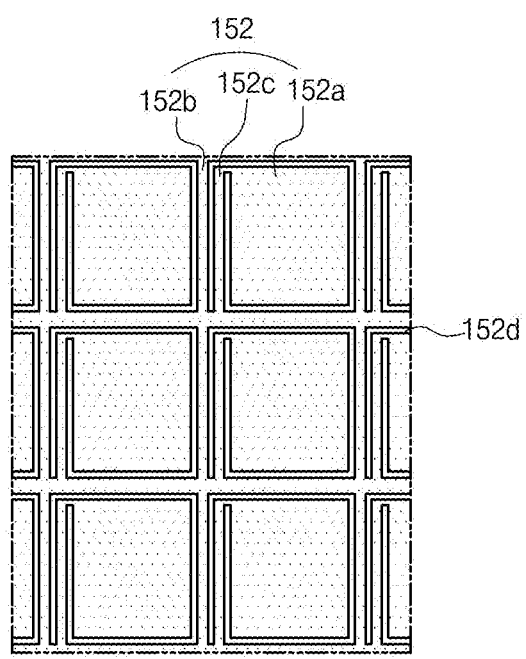
FIG. 4 is an enlarged top view illustrating a first electrode omitting the auxiliary electrode in FIG. 3.

The light emitting device of the present disclosure will be explained in more detail. FIG. 2 is a schematic cross-sectional view illustrating a light emitting device taken along a line II-II' in FIG. 1. FIG. 3 is an enlarged top view illustrating an area disposing a first electrode and an auxiliary electrode in the light emitting device in FIG. 1. FIG. 4 is an enlarged top view illustrating a first electrode omitting the auxiliary electrode in FIG. 3.

As illustrated in FIG. 2, the light emitting device 100 includes the substrate 110, the light emitting diode 150 over the substrate 110, a light extraction layer 120 disposed between the substrate 110 and the light emitting diode 150, a planarization layer 130 disposed between the light extraction layer 120 and the light emitting diode 150 and a buffer layer 140 disposed between the planarization layer 130 and the light emitting diode 150. In addition, the light emitting device 100 may further comprise an encapsulation layer 180, an adhesive film 182 and a protective insulation layer 184 for protecting the light emitting diode 150 from the external environment such as external moisture and the likes.

The substrate 110 includes a compound in which silicon atom (Si) and transparent metal atom are chemically bonded each other with a network structure so as to obtain a high refractive index, which will be described in more detail below.

The light extraction layer 120 is disposed over entire substrate 110 in order to improve the external quantum efficiency (EQE) of the light emitting device 100. As an example, the light extraction layer 120 may have an island shape disposed partly between the substrate 110 and the light emitting diode 150 or a photonic crystal pattern shape protruding randomly to the light emitting diode 150.

In another exemplary aspect, the light extraction layer 120 may include a binder whose refractive index "$n_4$" (See, FIG. 6) is between about 1.7 and about 3.0 and scattering particles dispersed in the binder in order to increase inner out-coupling efficiency of the light emitting diode 150, as illustrated in FIG. 2. The light extraction layer 120 having high refractive index 'n4' introduced on the substrate 110 can implement a light scattering effect due to refractive index differences with another components having a relatively low refractive index.

As an example, the light extraction layer 120 including scattering particles dispersed in the binder may have a concave-convex structure due to the scattering particles, which may be inorganic fine particles, on an opposite surface of the substrate 110. The binder in the light extraction layer 120 is not particularly limited and may be an organic, an inorganic or organic/inorganic hybrid or composite binder. For example, the binder in the light extraction layer may be inorganic or organic/inorganic hybrid or composite binder.

The inorganic or the organic/inorganic hybrid or composite binder has better thermal resistance properties, chemical-resistance properties than the organic binder. Accordingly, it is possible to increase physical and chemical properties such as lifetime of the light emitting diode 150 and to fabricate various types of diodes using the inorganic or the organic/inorganic hybrid or composite binder since the inorganic or the organic/inorganic hybrid or composite binder is not deteriorated even in high-temperature processes, photo-processes and etching process performed at 150° C. or more in the course of fabricating the light emitting diode 150.

As an example, the binder may include, but are not limited to, inorganic materials or organic/inorganic hybrid materials selected from silicon oxides (SiOx), silicon nitrides (SiNx), silicon oxynitrides (SiOxNy), alumina (Al2O3), siloxane-based materials, and combination thereof. For example, a siloxane-based inorganic binder may be fabricated by performing condensation polymerization process using siloxanes, or the organic/inorganic hybrid binders may include a material having alkyl groups in the siloxane-based materials.

The scattering particle of the light extraction layers 120 may be one of spherical, ellipsoidal or amorphous, spherical and ellipsoidal. The scattering particle may have a mean particle size between about 100 nm and about 300 nm, and may be about 150 nm and about 200 nm. The scattering particle may include any material that can scatter lights using the refractive index difference between the binder and the planarization layer 130. As an example, the scattering particle may include, but are not limited to, silicon, silica, glass, titanium oxide, magnesium fluoride, zirconium oxide, alumina, cerium oxide, hafnium oxide, niobium pentoxide, tantalum pentoxide, indium oxide, tin oxide, indium-tin oxide, zinc oxide, zinc sulfide, calcium carbonate, barium sulfonate, silicon nitrides, aluminum nitrides and combination thereof. As an example, the scattering particle may be titanium dioxide.

While not shown in FIG. 2, an outer light extraction layer may be disposed under the substrate so as to improve a haze. Similar to the (inner) light extraction layer 120, the outer light extraction layer (not shown) may include scattering particles, i.e. inorganic fine particles, dispersed in a binder, and may have a concave-convex structure due to the scattering particles, which may be inorganic fine particles, on an opposite surface of the substrate, and another planarization layer (not shown) may be disposed under the surface having the concave-convex structure.

Since the light extraction layer 120 has a rough surface owing to the inorganic fine particles, there may occur defects such as distortion of the light emitting diode 150 when the electrodes 152 and 156 and the emission layer 154 is positioned directly on the light extraction layer 120. In addition, the inorganic fine particles, which are scattering particles constituting the light extraction layer 120, may react with an oxide ion, an oxo ion, or a hydroxyl group produced from the ions to form a surface defect on the light extraction layer 120. Particularly, oxygen gas (O2) and/or moisture (H2O) introduced into the light emitting diode 150 is absorbed on the inorganic fine particles, so that the lifetime of the light emitting diode 150 may be shortened or the thin film structure of the light emitting diode 150 may be collapsed during fabricating the light emitting device 100.

The planarization layer 130 may be disposed on the light extraction layer 120 so as to planarize and enhance the surface of the light extraction layer 120 due to the inorganic particles which are scattering particles forming the light extraction layer 120. As an example, the planarization layer 130 may include an organic coating film or an inorganic coating film. When the planarization layer 130 forms the organic coating film, the planarization layer 130 may include a polyacrylate-based resin, a polyimide-based resin and combination thereof.

In an alternative aspect, when the planarization layer 130 forms the inorganic coating film, the planarization layer 130 may include an inorganic material selected from the group consisting of inorganic nitride such as silicon nitrides (SixNy), inorganic oxynitride such as silicon oxynitride (SixOyNz), inorganic oxide such as metal oxide (e.g. ZnO) and combination thereof. As an example, the planarization layer 130 may have a refractive index 'n3' (See, FIG. 6) between about 1.7 and about 2.0.

The buffer layer 140 is disposed on the planarization layer 130. The buffer layer 140 may have a mono-layered structure or a multiple-layered structure. As an example, the buffer layer 140 may include at least one of an organic insulating layer and an inorganic insulating layer. The organic insulating layer may include organic insulating material capable of passing through a light such as photo acryl and the inorganic insulating layer may include inorganic nitride layer such as silicon nitride (SixNy), inorganic oxy nitride layer such as silicon oxynitride (SixOyNz) and/or inorganic oxide layer such as silicon oxide (SixOy) and metal oxide such as ZnO.

In one exemplary aspect, the buffer layer 140 may include multiple organic-inorganic insulating layers. Each buffer layer may include the same material or different materials. For example, the buffer layer 140 may include a first buffer layer (not shown) including inorganic materials such as SixNy, SixOyNz, SixOy and/or ZnO, a second buffer layer (not shown) including organic materials such as photo acryl, and a third buffer layer (not shown) including inorganic materials such as SixNy, SixOyNz, SixOy and/or ZnO, which are laminated sequentially on the planarization layer 130.

In another exemplary aspect, the buffer layer 140 may include a first buffer layer (not shown) including inorganic oxide and a second buffer layer including inorganic nitride or oxynitirde, each of which is laminated sequentially on the planarization layer.

The light emitting diode 150 is disposed on the buffer layer 140. The light emitting diode 150 includes first and second electrodes 152 and 156 each of which is disposed over the whole substrate 110 and an emission layer 154 disposed between the first and second electrodes 152 and 156. Accordingly, the emission layer 154 illuminates and emits light toward the whole substrate 110 as electrical signals are applied into the first and second electrodes 152 and 156.

The first electrode 152 is disposed in the non-emission areas "NA1" and "NA2" as well as the emission area "EA". The first electrode 152 may be an anode and may include a conductive material having a relatively high work function value. For Example, the first electrode 152 may include, but are not limited to, a transparent doped or undoped metal oxide such as indium-tin-oxide (ITO), indium-zinc-oxide (IZO), indium-tin-zinc-oxide (ITZO), indium-copper-oxide (ICO), tin oxide (SnO2), indium oxide (In2O3), cadmium: zinc oxide (Cd:ZnO), fluorine:tin oxide (F:SnO2), indium: tin oxide (In:SnO2), gallium: tin oxide (Ga:SnO2) and aluminum: zinc oxide (Al:ZnO; AZO).

Alternatively, the first electrode 152 may include metal or non-metal material such as nickel (Ni), platinum (Pt), gold (Au), silver (Ag), iridium (Ir) or carbon nanotube (CNT) in addition to the above metal oxides.

Also, each of the first pad 172 and the second pad 174 is disposed over each of the first non-emission area "NA1" and the second non-emission area "NA2" defined on the substrate 110. Each of the first and second pads 172 and 174 may be made of the same materials as the first electrode 152 by the same mask process.

The auxiliary electrode 160 is disposed in the emission area "EA" and the non-emission areas "NA1" and "NA2" of the substrate 110 so that the auxiliary electrode 160 can be electrically connected to the first electrode 152. The first electrode 152 is made of transparent conductive material so as to pass through the light emitted from the emission layer 154, but the first electrode 152 has a higher electrical resistance compared to metal component. In case of fabricating the large-area light emitting device 100, the voltage applied into the light emitting device 100 is not uniformly distributed in the whole large emission area "EA" due the large electrical resistance of the transparent conductive material. It is very difficult to realize a uniform luminance in the large-area light emitting device 100 due to the unevenly distributed voltages. For example, the auxiliary electrode 160 may be arranged in the form of a matrix shape having thin width, a mesh shape, a polygonal shape such as a hexagon or an octagon or a circular shape over the entire emission area "EA", so that voltages are uniformly applied to the first electrode 152 corresponding to the whole emission area "EA". Accordingly, it is possible to achieve a uniform luminescence in the large-area light emitting device 100.

While the auxiliary electrode 160 is disposed on the first electrode 152 in FIG. 2, the auxiliary electrode 160 may be disposed over the first electrode. As an example, the auxiliary electrode 160 may be made of highly conductive metal such as aluminum (Al), silver (Ag), copper (Cu), titanium (Ti), tungsten (W), molybdenum (Mo) and their alloy. While the auxiliary electrode 160 has a single-layered structure in FIG. 2, the auxiliary electrode 160 may have a double-layered structure.

Alternatively, a passivation layer (not shown) may be laminated over the emission area "EA" and the non-emission areas "NA1" and "NA2" of the substrate 110. The passivation layer (not shown) disposed only on a part of the emission area "EA" is configured to cover the auxiliary electrode 160 and the first electrode 152, but is not disposed on an emitting region where the light is actually emitted. In addition, the passivation layer (not shown) in the emission area "EA" is formed so as to surround the auxiliary electrode 160, thereby reducing step differences by the auxiliary electrode 160. Accordingly, various layers to be formed thereafter can be stably formed without being broken. As an example, the passivation layer (not shown) may include an inorganic layer such as SiOx or SiNx or an organic layer such as a photo acryl. Alternatively, the passivation layer (not shown) may include multiple inorganic layers and/or multiple organic layers.

In an alternative aspect, the auxiliary electrode 160 may be arranged in a matrix shape along a bank layer 158 so as to overlap the bank layer 158. When the auxiliary electrode 160 is formed by the same mask process as the first electrode 152, the side surface of the auxiliary electrode 160 on the first electrode 152 may be stepped with respect to, or forms straight line with respect to, the side surface of the first electrode 152.

The emission layer 154 is on the first electrode 152. As an example, the emission layer 154 is formed on the first electrode 152 of the emission area "EA" defined by the bank layer 158. As an example, the emission layer 154 may have a mono-layered structure of an emitting material layer (EML).

Alternatively, the emission layer 154 may have a multiple-layered structure of plural charge control layers for expediting or controlling charge mobility such as a hole injection layer (HIL), a hole transport layer (HTL), an electron blocking layer (EBL), an hole blocking layer (HBL), an electron transport layer (ETL) and/or an electron injection layer (EIL) as well as the EML. In this case, the emission layer 154 may include a single emitting unit or may have a tandem structure where at least one charge generation layer (CGL) is disposed between multiple emitting units.

In one exemplary aspect, the emission layer 154 may emit one color among a red (R) color, a green (G) color, a blue (B) color, a yellow (Y) color and/or an orange (0) color. In an alternative aspect, tandem-structured multiple emission layers 154 may implement white (W) luminescence.

In one aspect, the light emitting diode 150 may be an organic light emitting diode (OLED) where the emission layer 154 includes organic luminous materials. In an alternative aspect, the light emitting diode 150 may be a quantum-dot light emitting diode (QLED) where the emission layer 154 includes inorganic luminescence particles such as quantum dots (QDs) and/or quantum rods (QRs).

As an example, when the emission layer 154 includes the luminous materials, an emitting material layer may include a host and a dopant. Each of the host and the dopant may include fluorescent or phosphorescent materials. The fluorescent material uses only singlet exciton among exciton energies (i.e. can use only 25% exciton energy). On the other hand, the phosphorescent material shows better luminous efficiency because the phosphorescent material can use the triplet exciton as well as the singlet exciton.

As an example, the phosphorescent dopant may include metal complexes in which organic ligands are coordinated to a heavy metal such as iridium. Alternatively, the dopant in the emitting material layer may include a delayed fluorescent material. The delayed fluorescent material can utilize the singlet exciton and the triplet exciton by Reverse Inter-Crossing System (RISC), so that the delayed fluorescent material can exhibit high luminous efficiency as the phosphorescent materials. However, the dopant in the emitting material layer is not limited to the phosphorescent dopant and/or the delayed fluorescent dopant.

The second electrode 156 is disposed over the substrate 110 above which the emission layer 154 is disposed. The second electrode 156 may be disposed over a whole emission area "EA" and may include a conductive material having a relatively low work function value compared to the first electrode 152. The second electrode 156 may be a cathode. For example, the second electrode 156 may include, but are not limited to, calcium (Ca), barium (Ba), Calcium/aluminum (Ca/Al), lithium fluoride/aluminum (LiF/Al), barium fluoride/aluminum (BaF2/Al), cesium fluoride/aluminum (CsF/Al), calcium carbonate/aluminum (CaCO3/Al), barium fluoride/calcium/aluminum (BaF2/Ca/Al), aluminum (Al), magnesium (Mg), silver (Ag), gold (Au), alloy thereof or combination thereof such as aluminum-magnesium alloy (Al—Mg), gold: magnesium (Au: Mg) and/or silver: magnesium (Ag: Mg). For example, each of the first and second electrodes 152 and 154 may be laminated with a thickness of, but are not limited to, about 5 nm to about 300 nm, and may be about 10 nm to about 200 nm.

The bank layer 158 may be formed along the auxiliary electrode 160 to overlap the auxiliary electrode 160, thus taking the form of an island that opens the emission area "EA" (i.e. the emission area is formed between respective portions of the bank layer 158). The bank layer 158 is formed to cover the side surface and the upper surface of the auxiliary electrode 160 and the side surface of the first electrode 152. In this case, since the distance between the second electrode 156 and each of the first electrode 152 and the auxiliary electrode 160 is increased by the thickness of the bank layer 158, the occurrence of short-circuit failures between the second electrode 156 and each of the first electrode 152 and the auxiliary electrode 160 may be reduced.

In addition, since the bank layer 158 is formed to cover the side surface of the first electrode 152, for example, corrosion of the first electrode 152 may be prevented. The bank layer 158 may be made of an organic insulating material having a photo-initiator, for example, photo acryl. The bank layer 158 formed of an organic insulating material may be formed via a photolithography process alone, without an etching process, which may simplify processing.

In an exemplary aspect, the first electrode 152 may include a short-circuit-preventing portion 152c. In this case, the bank layer 158 may be made of an inorganic material. As illustrated in more detail in FIGS. 3 to 5, the first electrode 152 includes an electrode portion 152a, a contact portion 152b and the short-circuit-preventing portion 152c.

The electrode portion 152a is the region that overlaps the emission area "EA" defined by the bank layer 158, and overlaps the second electrode 156 with the emission layer 154 interposed therebetween. The contact portion 152b is disposed underneath the auxiliary electrode 160 to come into contact with the auxiliary electrode 160, and is formed in a lattice shape corresponding to the auxiliary electrode 160.

The short-circuit-preventing portion 152c is located between the electrode portion 152a and the contact portion 152b of the first electrode 152. The short-circuit-preventing portion 152c is spaced apart from each of the electrode portion 152a and the contact portion 152b by a predetermined distance, with an electrode hole 152d interposed therebetween (See, FIG. 4). As illustrated in FIG. 4, the short-circuit-preventing portion 152c may have a smaller line width than each of the electrode portion 152a and the contact portion 152b so as to have a higher electrical resistance value than each of the electrode portion 152a and the contact portion 152b. Thereby, when a short-circuit failure or defect is generated by, for example, foreign substances between the first electrode 152 and the second electrode 156 in a predetermined emission area "EA", the short-circuit-preventing portion 152c prevents the leakage of current from the light emitting diode 150 in adjacent emission area through the short-circuit defect.

Since the bank layer 158 formed of an inorganic insulation material may have a smaller height than the bank layer formed of an organic insulation material, the height difference between the first electrode 152 and the bank layer 158 may be reduced in an exemplary aspect. As a result, the upper layer (e.g., the emission layer 154 and the second electrode 156), which is disposed on the bank layer 158 to cover the bank layer 158, may improve its step coverage. As the upper layer disposed on the bank layer 158 has improved step coverage, when an encapsulation layer 180 is formed via a roll-printing process, the step coverage of the encapsulation layer 180 may also be improved, which ensures an easy encapsulation process. In addition, the bank layer 158 is disposed to cover the upper surface and the side surface of each of the contact portion 152b and the short-circuit-preventing portion 152c of the first electrode 152 as well as the side surface of the electrode portion 152a. In this case, since the distance between the second electrode 156 and each of the first electrode 152 and the auxiliary electrode 160 is increased by the thickness of the bank layer 158, the occurrence of short-circuit failure between the second electrode 156 and each of the first electrode 152 and the auxiliary electrode 160 may be reduced.

The encapsulation layer 180 is bonded to the substrate 110 on which the light emitting diode 150 has been formed through an adhesive film 182, which is formed on the entire surface of the encapsulation layer 180, to seal the light emitting diode 150. As a result, the encapsulation layer 180 prevents external moisture or oxygen from the upper side thereof from entering into the light emitting diode 150. The encapsulation layer 180 may be made of any material that can prevent the external moisture or oxygen from being introduced into the light emitting diode 150. As an example, the encapsulation layer 180 may include, but are not limited to, a polymer such as epoxy-based resin, polyacrylate-based resin, polyacryl-based resin and/or polyethylene terephthalate (PET) or thin metal foil such as aluminum.

An adhesive forming the adhesive film 182 may include, but are not limited to, photo-curable adhesives or thermally-curable adhesives. As an example, the adhesive may include, but are not limited to, acrylate-based and/or epoxy-based pressure sensitive adhesives (PSA) and/or optically clear adhesives (OCA).

Also, a protective insulation layer 184 is formed between the second electrode 156 and the adhesive film 182. The protective insulation layer 184 is formed to cover the side surface and the upper surface of the light emitting diode 150, and therefore prevents external moisture, hydrogen and/or oxygen from being entering into the light emitting diode 150. As an example, the protective insulation layer 184 is formed of an inorganic insulation layer such as SiOx and SiNx or an organic insulation layer such as photo acryl.

Figure 5:
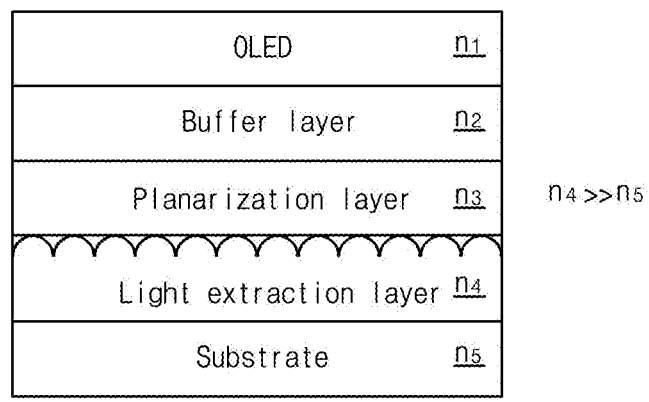
FIG. 5 is a schematic diagram illustrating a disadvantage owing to a refractive indices differences between a buffer layer and a light extraction layer in case of applying a low refractive substrate.

With referring to FIG. 5, which is a schematic diagram illustrating a disadvantage owing to a refractive indices differences between a buffer layer and a light extraction layer in case of applying a prior art low refractive substrate, the planarization layer 130 has a refractive index 'n3' between about 1.7 and about 2.0, while the light extraction layer 120 has a refractive index 'n4' between about 1.7 and about 3.0. Since the light emitting diode 150, the buffer layer 140 and the planarization layer 130 have the substantially the same refractive indices "$n_1$", "$n_2$" and "$n_3$", light refraction or reflection hardly occurs even when the light emitted from the light emitting diode 150 passes through the buffer layer 140 and the planarization layer 130.

On the other hand, the prior art substrate is made of glass or plastic material such as polyimide (PI). The substrate made of glass or the plastic material has a relatively low refractive index '$n_5$' of about 1.5. In other words, the refractive index '$n_5$' of the prior art substrate is much lower than each of the refractive index '$n1$' of the light emitting diode, the refractive index "$n_2$" of the buffer layer, the refractive index "$n_3$" of the planarization layer and the refractive index '$n4$' of the light extraction layer. When the light enters into an optically rare medium having a low refractive index from an optically dense medium having a high refractive index, total reflection occurs at an incident angle exceeding a critical angle. The total reflection increases in proportion to the square of the refractive index differences as the refractive index differences between the media increase.

Accordingly, when the light is incident on the prior substrate having the relatively low refractive index '$n5$' from the light extraction layer having the relatively high refractive index '$n4$', the light is not emitted to the outside and the amount of totally reflected light becomes very large in the prior art light emitting device. Particularly, since the first electrode 152 and the emission layer 154 in the light emitting diode 150 have a very thin film shape, most of the light generated in the emission layer 154 is not emitted to the outside of the light emitting diode 150 but is in the waveguide mode. The light scattering effect due to the introduction of the light extraction layer 120 is greatly reduced and the out-coupling efficiency is not greatly improved due to the low refractive index '$n5$' of the substrate which is considerably lower than the refractive index '$n4$' of the light extraction layer.

As an example, when a glass substrate having a refractive index '$n5$' of about 1.5 is employed in the prior art light emitting device having the light emitting diode, the light having incident angles equal to or more that the critical angle is not emitted to the outside, but is totally reflected and isolated inside the prior art substrate. Since the amount of such isolated light amounts to about 35% of the light emitted from the light emitting diode, the amount of light emitted from the light emitting diode to the outside of the prior art glass substrate is only about 20%, i.e. the out-coupling efficiency is only 20%.

Figure 6:
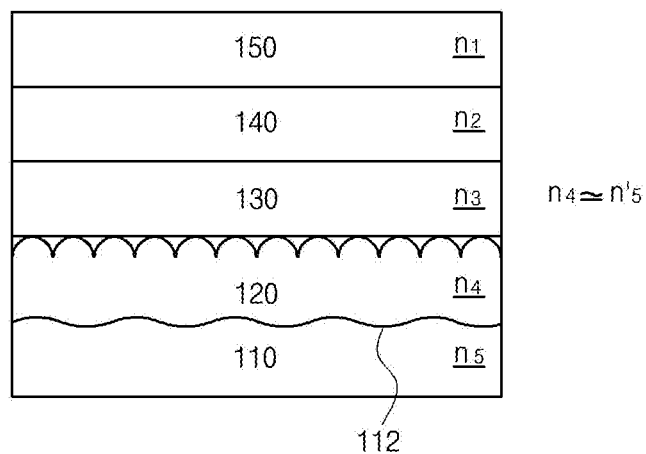
FIG. 6 is a schematic diagram illustrating an improved out-coupling efficiency by applying a high refractive substrate of the present disclosure.

On the other hand, with referring to FIG. 6, which is a schematic diagram illustrating an improved out-coupling efficiency by applying a high refractive substrate of the present disclosure, the substrate 110 having high refractive index '$n'5$' is made of material in which silicon atom (Si) is chemically bonded to a transparent metal. In one exemplary aspect, a solution process such as sol-gel reaction between a silicon precursor and a metal precursor may be used to fabricate the substrate having high refractive index '$n'5$'. But, the high refractive substrate 110 may be fabricated by other synthesizing process other than the sol-gel reaction between the silicon precursor and the metal precursor.

As an example, when the sol-gel reaction is performed using the silicon precursor and metal compound having at least two alkoxy group as the metal precursor, a compound having network structure among the silicon atom and the metal atom through oxane (ether, —O—) bonds can be easily synthesized. When the sol-gel reaction performs, alkoxy groups as hydrolysable groups in the silicon and metal precursors are hydrolyzed to hydroxyl group. The silicon atom and the metal atom are bonded to each other through the network of oxane (ether) bonds as condensation reactions where water molecules are released between the hydrolysable hydroxyl groups of the silicon and metal precursors occur.

As an example, the silicon precursor having the alkoxy group may be silanes having one of at least two, at least three, and four alkoxy groups. Silanes having two alkoxy groups may include, but are not limited to, Dimethyldiethoxysilane (DMDES), Methyl(vinyl)diethoxysilane (MVDES), 3-Aminopropyl(methyl)diethoxysilane (APMDES), 3-Acryloxypropyl)methyldimethoxysilane (APDMS), 3-glycidoxylpropyl(methyl)diethoxysilane (GPMDES) and/or methyl(phenyl)diethoxysilane (MPDES).

Silanes having three alkoxy groups may include, but are not limited to, Methyltriethoxysilane (MTES), Ethyltriethoxysilane (ETES), n-propyltriethoxysilane (PTES), Octyltriethoxysilane (OTES), Vinyltriethoxysilane (VTES), 3-Aminopropyltrimethoxysilane (APTMS), 3-Aminopropyltriethoxysilane (APTES), 3-(2-Aminoethylamino)propyltrimethoxysilane (AEPTMS), (3-Acryloxypropyl)trimethoxysilane (APTMS), Methacryloxymethyltriethoxysilane (MMS), 3-Methacryloxypropyltrimethoxysilane (MPTMS), 3-Methacryloxypropyltriethoxysilane (MPTES), 3-Mercaptopropyltriethoxysilane (MPTES), 3-Isocyanatopropyltriethoxysilane (ICPTES), 2-(3,4-Epoxycyclohexyl)ethyltriethoxysilane (ECETMS), 3-Glycidyloxypropyltrimethoxysilane (GPTMOS), 3-Glycidyloxypropyltriethoxysilane (GPTEOS), Phenyltrimethoxysilane (PTES), (4-chlorophenyl)triethoxysilane (CPTES) and/or [3-(phenylamino)propyl]trimethoxysilane (PAPTMS).

Silanes having four alkoxy groups, i.e. silicates, may include, but are not limited to, tetramethylortho silicate, i.e. tetramethoxy silane (TMOS), tetraethylortho silicate, i.e. tetraethoxysilane (TEOS), Tetrapropylortho silicate, i.e. tetrapropoxylsilane, tetrabutylortho silicate, i.e. tetrabuthoxysilane and/or tetrapentylortho silicate, i.e. tetrapentoxysilane.

The metal precursor may include metal alkoxide that is easy to induce the sol-gel reaction and may change from an oxide state to a clear or white state. As an example, the metal atom in the high refractive substrate 110 may be selected from the group consisting of titanium (Ti), zirconium (Zr), hafnium (Hf), zinc (Zn), tellurium (Te) and combination thereof. For example, metal alkoxide may include, but are not limited to, metal ethoxides, metal propoxides, metl iso-propoxides, metal butoxides and metal iso-butoxides.

The silicon precursor and the metal precursor as a starting material for fabricating the high refractive substrate 100 may be dispersed in an adequate solvent. The solvent capable of dispersing the silicon and metal precursors may include, but are not limited to, an aliphatic alcohol-based solvent, an aliphatic ketone-based solvent, an ether-based solvent, an aliphatic ester-based solvent, an aliphatic or an aromatic amide-based solvent, an aliphatic hydrocarbon-based solvent, an aromatic hydrocarbon-based solvent, acetonitrile, an aliphatic sulfoxide-based solvent and combination thereof.

The alcohol-based solvent may include methanol, ethanol, iso-propanol, butanol, n-propanol, ethylene glycol, propylene glycol, butandiol, neopentyl glycol, 1,3-pentandiol, 1,4-cyclohexanediol, di-ethylene glycol, poly-ethylene glycol, poly-butylene glycol, dimethylol propane, trimethylol propane, sorbitol and esterfied products thereof.

The aliphatic ketone-based solvent may include acetone, diacetone alcohol (4-hydroxyl-4-methyl penthan-2-on), methyl ethyl ketone (MEK; butanone), and the likes. The ether-based solvent may include methyl cellosolve (2-methoxy ethanol), ethyl cellosolve (2-ethoxy ethanol), dibutyl ether, propylene glycol methyl ether (1-methoxy-2-propanol), tetrahydrofuran, mono- or poly alkylene glycol dialkyl ether, and the likes. The aliphatic carboxylic acid ester-based solvent may include butyl acetate and the likes and the aliphatic or aromatic amide-based solvent may include dimethyl formamide (DMF), N-methyl pyrrolidone (NMP) and the likes.

In a state where the silicon and metal precursors are dispersed in the organic solvent, a sol-gel reaction can be performed using a catalyst as necessary. As an example, the sol-gel reaction may be performed, but are not limited to, at a temperature between about 500° C. to about 1,000° C. ranges. In one exemplary aspect, the compound constituting the high refractive substrate 100 may have the following structure of Chemical Formula 1.

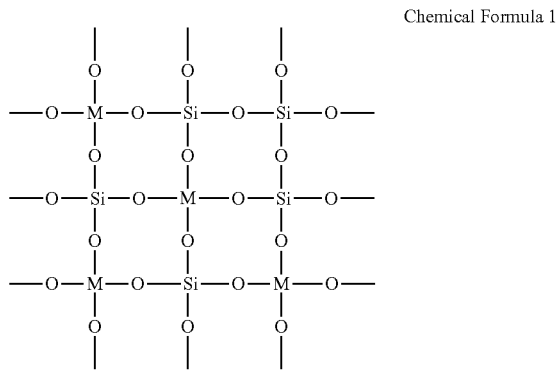

Chemical Formula 1

In Chemical Formula 1, M is a metal atom selected from the group consisting of Ti, Zr, Hf, Zn, Te and combination thereof.

It is possible to control the refractive index 'n'5' of the substrate 110 by adjusting the relative contents ratio between the silicon atom and the metal atom in accordance with the present disclosure. As the content ratio of the metal atom to the silicon atom increases, the refractive index 'n'5' of the substrate 110 tends to increase. As a result, the substrate 110 having a high refractive index 'n'5', which matches to the indices 'n1', 'n2', 'n3' and 'n4' of the light emitting diode 150, the buffer layer 140, the planarization layer 130 and the light extraction layer 120, may be fabricated with ease by adjusting the molar ratio of the silicon and metal precursors as the starting materials.

In one exemplary aspect, the silicon atom and the metal atom in the high refractive substrate 110 may be, but are not limited to, mixed with molar ratios of about 7:3 to about 3:7. By adjusting the molar ratio or the mixing ratio of the silicon atom and the metal atom, the refractive index 'n'5' of the substrate 110 may be adjusted between about 1.7 and about 2.3.

Moreover, it is possible to separate a carrier substrate from the high refractive substrate 110 after inducing a sol-gel reaction on a carrier substrate such as a glass substrate so as to fabricate the high refractive substrate 100 and forming the light emitting diode 150 and the likes of the light emitting device 100. When manufacturing the light emitting device 100 including the high refractive substrate 110 of the present disclosure, the carrier substrate can be applied similarly to the prior art plastic substrate, and there is an advantage that LLO (laser lift off) equipment is not required.

The out-coupling efficiency of the light emitting device can be improved by applying the high refractive index. With referring to FIG. 6, each of the refractive indices 'n1' and 'n2' of the light emitting diode 150 and the buffer layer 140 is approximately between 1.7 and 2.0, as described above. The planarization layer 130 has the refractive index 'n3' between about 1.7 and about 2.0, while the light extraction layer 120 has the refractive index 'n4' between about 1.7 and about 3.0. Since the light emitting diode 150, the buffer layer 140 and the planarization layer 130 have the substantially the same refractive indices 'n1', 'n2' and 'n3', the light emitted from the light emitting diode 150 is transmitted through the buffer layer 140 and the planarization layer 130 with hardly light refraction or reflection.

In addition, the substrate 110 made of the compound where the silicon atom is chemically bonded to the metal atom in a network structure (for example, the compound having the structure of Chemical Formula 1), has the refractive index 'n'5' between about 1.7 to about 2.3. The refractive index 'n'5' of the substrate 110 of the present disclosure is substantially the same as the refractive index 'n4' of the light extracting layer 140. Therefore, the light incident on the substrate 110 from the light extraction layer 120 is transmitted without being reflected. As a result, the light emitting device 100 can improve its out-coupling efficiency and its luminous efficiency.

Moreover, the high refractive substrate 110 of the present disclosure can be manufactured through a solution process such as the sol-gel reaction. The shape of the substrate 110 may be controlled so that the interface between the light extraction layer 120 and the substrate 110 has a curved cross-section 112 by controlling solution process conditions. When the interface between the substrate 110 and the light extraction layer 120 is configured to have a rough shape such as the curved cross-section 112 as compared to a flat interface, the critical angel which is the minimum incident angle at which total reflection occurs in the incident light becomes large. Accordingly, the amount of light totally reflected at the interface between the light extraction layer 120 and the substrate 110 is reduced, and the amount of light emitted outwardly through the high refractive substrate 110 is further increased and the luminous efficiency of the light emitting device 100 can be maximized.

In the above-described aspect, the light extraction layer, the planarization layer and the buffer layer interposed between the substrate and the light emitting diode are arranged over the emission area and the non-emission areas. In this case, since the buffer layer including the organic material is vulnerable to moisture or oxygen, an encapsulation layer covering those layers is located. However, the encapsulation layer alone may have a limitation in preventing external moisture or oxygen from penetrating into the buffer layer including the organic material.

Figure 7:
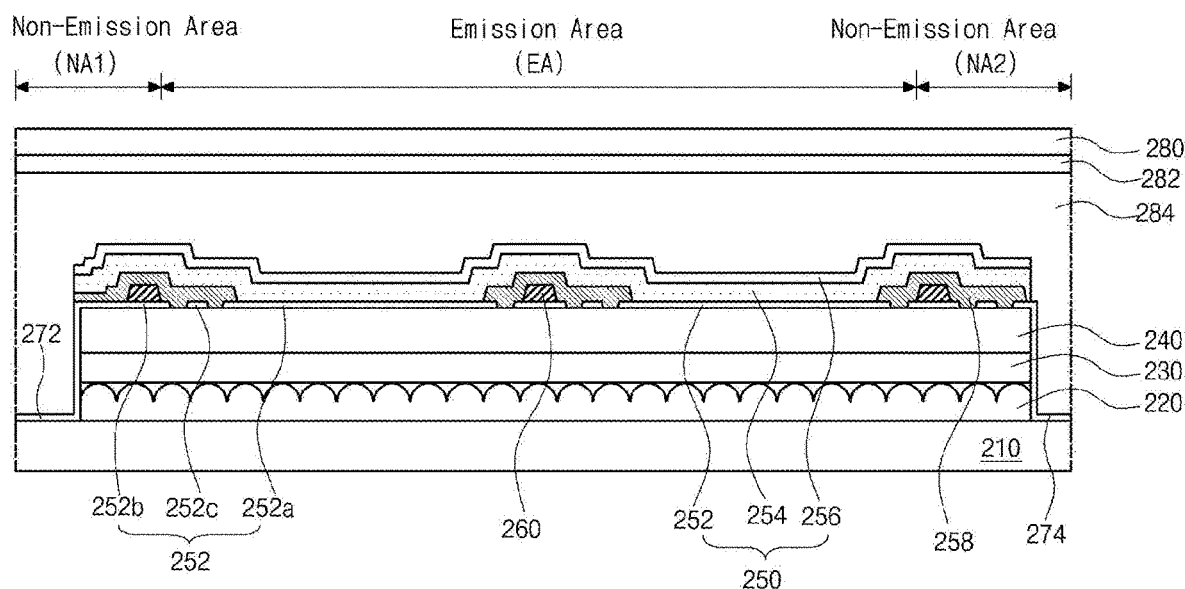
FIG. 7 is a schematic cross-sectional view illustrating a light emitting device in accordance with another exemplary aspect of the present disclosure.

In accordance with the second aspect of the present disclosure, it is possible to provide a light emitting device exhibiting double encapsulation function to the buffer layer and the likes. FIG. 7 is a schematic cross-sectional view illustrating a light emitting device in accordance with another exemplary aspect of the present disclosure. The other configurations, except of the first electrode structure and arrangement positions of the buffer layer, are substantially the same as the light emitting device in the above first aspect.

As illustrated in FIG. 7, the light emitting device 200 in accordance with the second aspect of the present disclosure includes a substrate 210, a light emitting diode 250 disposed over the substrate 210, a light extraction layer 220, a planarization layer 230 and a buffer layer 240 which are disposed sequentially between the substrate 210 and the light emitting diode 250 and an encapsulation layer 280 covering the light emitting diode 250 and the likes.

The substrate 210 defines the emission area "EA" and the non-emission areas "NA1" and "NA2" and includes the compound where silicon atoms are bonded to transparent metal atoms with a network structure to have high refractive index 'n'5' (See, FIG. 6). In order to fabricate high refractive substrate 210, sol-gel reaction may be performed using the silicon precursor and the metal precursor.

As an example, the high refractive substrate 210 may be fabricated by solution process such as sol-gel reaction using the silicon alkoxide and metal alkoxide as a starting material. The substrate 210 may include the compound where the silicon metal and the metal atom (e.g. at least one of titanium, zirconium, hafnium, zinc and tellurium) are bonded together with a network structure, as illustrated in Chemical Formula 1, by the reactions between those precursors. A carrier substrate may be used so as to perform the sol-gel reaction and the carrier substrate may be removed after manufacturing the light emitting device 200. In one exemplary aspect, the silicon atom and the metal atom in the high refractive substrate 210 may be, but are not limited to, mixed with molar ratios of about 7:3 to about 3:7, and the refractive index 'n'5' of the substrate 210 may be adjusted between about 1.7 and about 2.3.

The light extraction layer 220 is located on the substrate 210. The light extraction layer 220 may have an island shape disposed partly between the substrate 210 and the light emitting diode 250 or a light-crystal pattern shape protruding randomly to the light emitting diode 250.

In another exemplary aspect, the light extraction layer 220 may include a binder whose refractive index "n4" (See, FIG. 6) is between about 1.7 and about 3.0 and scattering particles dispersed in the binder in order to increase inner out-coupling efficiency of the light emitting diode 250. The light extraction layer 220 having high refractive index 'n4' introduced on the substrate 210 can implement a light scattering effect due to refractive index differences with another components having a relatively low refractive index.

As an example, the light extraction layer 220 including scattering particles dispersed in the binder may have a concave-convex structure due to the scattering particles, which may be inorganic fine particles, on an opposite surface of the substrate 210. As illustrated in FIG. 6, the interface between the substrate 210 and the light extraction light 220 may have the curved cross-section 112 structure.

The planarization layer 230 is disposed on the light extraction layer 220 so as to planarize and enhance the surface of the light extraction layer 220. The planarization layer 230 may be an organic coating film or an inorganic coating film.

The buffer layer 240 is disposed on the planarization layer 230. The buffer layer 240 may have a mono-layered structure or a multiple-layered structure. As an example, the buffer layer 240 include a first buffer layer (not shown) including inorganic materials such as SixNy, SixOyNz, SixOy and/or ZnO, a second buffer layer (not shown) including organic materials such as photo acryl, and a third buffer layer (not shown) including inorganic materials such as SixNy, SixOyNz, SixOy and/or ZnO, which are laminated sequentially on the planarization layer 230.

The light emitting diode 250 is disposed on the buffer layer 240. A first electrode 252 and a second electrode 256 are disposed over an entire surface of the substrate 210 and an emission layer 254 is disposed between the first and second electrode 252 and 256. As electrical signals are applied into the first and second electrodes 252 and 256, the emission layer 254 illuminate and emit light toward the entire substrate 210.

The first electrode 252 may be disposed in the non-emission areas "NA1" and "NA2" as well as the emission area "EA" and may be an anode. As an example, the first electrode 252 may include, but are not limited to, a transparent doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO). Alternatively, the first electrode 252 may include metal or non-metal material such as nickel (Ni), platinum (Pt), gold (Au), silver (Ag), iridium (Ir) or carbon nanotube (CNT) in addition to the above metal oxides.

Each of a first pad 272 and a second pad 274 is disposed over each of the first non-emission area "NA1" and the second non-emission area "NA2" defined on the substrate 110. Also, an auxiliary electrode 260 is disposed in the non-emission areas "NA1" and "NA2" as well as the emission area "EA" of the substrate 210 so that the auxiliary electrode 260 can be electrically connected to the first electrode 252. The auxiliary electrode 260 is disposed on or underneath the first electrode 252 and is made of a high electrical conductive material. As an example, the auxiliary electrode 260 may be arranged in a matrix shape along a bank layer 258 so as to overlap the bank layer 258.

The emission layer 254 is disposed on the first electrode 252. As an example, the emission layer 254 is formed on the first electrode 252 of the emission area "EA" defined by the bank layer 258. The emission layer 254 may have a mono-layered structure of an emitting material layer. Alternatively, the emission layer 254 may further include multiple charge control layers such as HIL, HTL, EBL, HBL, ETL and/or EIL. The emission layer 254 may include a single emitting unit or may have a tandem structure where at least one charge generation layer (CGL) is disposed between multiple emitting units.

The emission layer 254 may emit one color among a red (R) color, a green (G) color, a blue (B) color, a yellow (Y) color and/or an orange (0) color. In an alternative aspect, tandem-structured multiple emission layers 254 may implement white (W) luminescence. In one aspect, the light emitting diode 250 may be an organic light emitting diode (OLED) where the emission layer 254 includes organic luminous materials. In an alternative aspect, the light emitting diode 150 may be a quantum-dot light emitting diode (QLED) where the emission layer 254 includes inorganic luminescence particles such as quantum dots (QDs) and/or quantum rods (QRs).

The second electrode 256 is disposed over the substrate over which the emission layer 254 is disposed. The second electrode 256 may be a cathode. As an example, the second electrode 256 may include, but are not limited to, Ca, Ba, Ca/Al, LiF/Al, $BaF_2$/Al, CsF/Al, CaCO3/Al, $BaF_2$/Ca/Al, Al, Mg, Ag, Au, Al—Mg, Au: Mg and/or Ag: Mg.

The bank layer 258 may be formed along the auxiliary electrode 260 to overlap the auxiliary electrode 260, thus taking the form of an island that opens the emission area "EA". The bank layer 258 is formed to cover the side surface and the upper surface of the auxiliary electrode 260 and the side surface of the first electrode 252. In one exemplary aspect, the bank layer 258 may be made of organic insulating material having a photo-initiator, for example, photo acryl. The bank layer 258 formed of an organic insulating material may be formed via a photolithography process alone, without an etching process, which may simplify processing.

In an exemplary aspect, the first electrode 252 may include a short-circuit-preventing portion 252c. Particularly, the first electrode 252 includes an electrode portion 252a, a contact portion 252b and the short-circuit-preventing portion 252c.

The electrode portion 252a is the region that overlaps the emission area "EA" defined by the bank layer 258, and overlaps the second electrode 256 with the emission layer 254 interposed therebetween. The contact portion 252b is disposed underneath the auxiliary electrode 260 to come into contact with the auxiliary electrode 260, and is formed in a lattice shape corresponding to the auxiliary electrode 260.

The short-circuit-preventing portion 252c is located between the electrode portion 252a and the contact portion 252b of the first electrode 252. The short-circuit-preventing portion 252c is spaced apart from each of the electrode portion 252a and the contact portion 252b by a predetermined distance, with an electrode hole (not shown) interposed therebetween (See, FIG. 4). The short-circuit-preventing portion 252c may have a smaller line width than each of the electrode portion 252a and the contact portion 252b so as to have a higher electrical resistance value that each of the electrode portion 252a and the contact portion 252b.

In another exemplary aspect, the bank layer 258 may be made of an inorganic material. Since the bank layer 258 formed of an inorganic insulation material may have a smaller height than the bank formed of an organic insulation material, the height difference between the first electrode 252 and the bank layer 258 may be reduced in an exemplary aspect. As a result, the upper layer (e.g., the emission layer 254 and the second electrode 256), which is disposed on the bank layer 258 to cover the bank layer 258, may improve its step coverage and the step coverage of the encapsulation layer 280 may also be improved, which ensures an easy encapsulation process.

The encapsulation layer 280 is bonded to the substrate 210 on which the light emitting diode 250 has been formed through an adhesive film 282, which is formed on the entire surface of the encapsulation layer 280, to seal the light emitting diode 250. As a result, the encapsulation layer 280 prevents the external moisture or oxygen from entering into the light emitting diode 250. Also, a protective insulation layer 284 is formed between the second electrode 256 and the adhesive film 282.

Similar to the first aspect (shown in FIG. 6), it is possible to minimize total reflection of the light incident on the substrate 210 from the light extraction layer 220 by applying the substrate 210 having a high refractive index 'n'5', which matches to the indices 'n1', 'n2', 'n3' and 'n4' of the light emitting diode 250, the buffer layer 240, the planarization layer 230 and the light extraction layer 220. In addition, the shape of the substrate 210 may be controlled so that the interface between the light extraction layer 220 and the substrate 210 has a curved cross-section 112 (shown in FIG. 6) by controlling solution process conditions. When the interface between the substrate 210 and the light extraction layer 220 is configured to have a rough shape such as the curved cross-section 112 (shown in FIG. 6) as compared to a flat interface, the critical angel which is the minimum incident angle at which total reflection occurs in the incident light becomes large. Accordingly, the amount of light totally reflected at the interface between the light extraction layer 220 and the substrate 210 is reduced, and the amount of light emitted outwardly through the high refractive substrate 210 is further increased and the luminous efficiency of the light emitting device 200 can be maximized.

In accordance with the second aspect of the present disclosure, each of the light extraction layer 220, the planarization layer 230 and the buffer layer 240 is disposed between the substrate 210 and the light emitting diode 250 only in the emission area "EA". The light extraction layer 220 may include an organic binder, the planarization layer 230 may include polymer such as a polyacrylate-based resin and/or a polyimide-based resin, and the buffer layer 240 may include an organic material such as photo acryl.

Compared with an inorganic material, the organic material in the light extraction layer 220, the planarization layer 230 and/or the buffer layer 240 is very vulnerable to moisture or oxygen penetrating from the external environment. Therefore, the organic material in the light extraction layer 220, the planarization layer 230 and/or the buffer layer 240 may be decomposed with collapsing the structure of the organic material by the penetration of moisture or oxygen. In this case, the extraction layer 220, the planarization layer 230 and/or the buffer layer 240 including the organic material cannot exhibit its intended functions.

In accordance with the second aspect of the present disclosure, the light extraction layer 220, the planarization layer 230 and the buffer layer 240, which are disposed between the substrate 210 and the light emitting diode 250, is positioned only in the emission area "EA". The first electrode 252 made of an inorganic material such as a conductive oxide is vertically along the outside of those layers 220, 230 and 240 and is in physically contact with the substrate 210. Both ends of the first electrode 252 extend outwardly in the region in contact with the substrate 210 to form the pads 272 and 274.

The light extraction layer 220, the planarization layer 230 and the buffer layer 240, which may include the organic materials, are firstly sealed by the encapsulation layer 280 and secondarily by the first electrode 252. External moisture and/or oxygen can be effectively blocked by the encapsulation layer 280 and the first electrode 252 so that moisture and/or oxygen penetration into the light extraction layer 220, the planarization layer 230 and the buffer layer 240 can be minimized.

Synthesis Example 1

Fabrication of High Refractive Substrate

Tetraethyl orthosilicate (TEOS) as a silicon precursor and titanium alkoxide as a titanium precursor with a molar ratio of 70:30 was dispersed in an organic solvent and then sol-gel reaction was performed to fabricate a substrate including a compound in which silicon is bonded to titanium by oxane linkage.

Synthesis Examples 2-3

Fabrication High Refractive Substrate

Substrate was fabricated as the same process and the same material as the Synthesis Example 1 except modifying the molar ratio of the silicon precursor and the titanium precursor to 55:45 (Synthesis Example 2) or 50:50 (Synthesis Example 3) in place of 70:30.

EXAMPLE 1

Measurement of Refractive Index

Refractive index "n" and extinction coefficient "k" for the substrates fabricated in the Synthesis Examples 1 to 3 were measured. For comparison, refractive index and extinction coefficient for a referenced material in which zirconium oxide (ZrO) is dispersed in a polysiloxane binder (Ref. 1) and a polysiloxane binder (Ref. 2) were also measured. The measurement results are indicated in the following Table 1.

TABLE 1

Refractive Index and Extinction Coefficient

| | n | | | k | | |
|---|---|---|---|---|---|---|
| Sample | 450 nm | 550 nm | 633 nm | 450 nm | 550 nm | 633 nm |
| Ref. 1 | 1.628 | 1.633 | 1.641 | 0.027 | 0.026 | 0.025 |
| Ref. 2 | 1.533 | 1.522 | 1.517 | 0.001 | 0.006 | 0.006 |
| Synthesis Example 1 | — | 1.70 | — | — | — | — |
| Synthesis Example 2 | 1.970 | 1.916 | 1.897 | 0.024 | 0.016 | 0.010 |
| Synthesis Example 3 | — | 2.05 | — | — | — | — |

As indicated in Table 1, each of the substrate fabricated in the Synthesis Examples 1 to 3 have a refractive index of 1.70, 1.91 and 2.05 at 550 nm. It was confirmed that the substrate increased its refractive index as the contents of the titanium as the metal atom increases.

EXAMPLE 2

Measurement of Luminous Efficiency as Refractive Index

A power efficiency (lm/W) as a luminous efficiency of a light emitting diode applying a high refractive substrate was simulated, as the refractive index of a buffer layer was set to 1.82, with or without introducing an internal light extracting layer consisting of inorganic particles. The measurement results are indicated in the following Table 2:

TABLE 2

Evaluation of Luminous Efficiency by Application of High Refractive Substrate

| | Condition | | | |
|---|---|---|---|---|
| No. | Buffer layer Refractive Index | Substrate Refractive Index | Light Extraction layer | lm/W |
| 1 | 1.82 | 1.65 | X | 80 |
| 2 | | | O | 88 |
| 3 | | 1.70 | X | 85 |
| 4 | | | O | 95 |
| 5 | | 1.75 | X | 91 |
| 6 | | 1.80 | X | 96 |
| 7 | | 1.90 | X | 93 |

As indicated in Table 2, the light emitting diode showed increased power efficiency as the substrate shows increased refractive index. Particularly, when the refractive index of the substrate matches to the refractive index of the buffer layer, the light emitting diode showed maximal power efficiency. These results may indicate that if the refractive index of the substrate is substantially the same as the refractive index of the buffer layer, the light incident from the buffer layer to the substrate is transmitted outwardly without being totally reflected, thereby improving out-coupling efficiency. Combining the results of Examples 1 and 2 shows that the high refractive substrate of the present disclosure can be applied to a light emitting device to improve the out-coupling efficiency and thereby enhancing the luminous efficiency of the light emitting device.

While the present disclosure has been described with reference to exemplary aspects and examples, these aspects and examples are not intended to limit the scope of the present disclosure. Rather, it will be apparent to those skilled in the art that various modifications and variations can be made in the present disclosure without departing from the spirit or scope of the disclosure. Thus, it is intended that the present disclosure cover the modifications and variations of the present disclosure provided they come within the scope of the appended claims and their equivalents.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects can be modified, if necessary to employ concepts of the various patents, applications and publications to provide yet further aspects.

These and other changes can be made to the aspects in light of the above detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A light emitting device, comprising:
a substrate including an emission area and a non-emission area, wherein the substrate comprises a compound in which a silicon (Si) atom is chemically bonded to a metal atom selected from the group consisting of titanium (Ti), zirconium (Zr), hafnium (Hf), zinc (Zn), tellurium (Te) and combination thereof;
a light emitting diode disposed over the substrate and including a first electrode, an emission layer and a second electrode;
an auxiliary electrode directly contacting the first electrode;
a buffer layer disposed between the substrate and the light emitting diode; and
a light extraction layer disposed between the buffer layer and the substrate,
wherein the first electrode includes a contact portion directly contacting the auxiliary electrode, an electrode portion disposed in the emission area and a short-circuit-preventing portion disposed between the contact portion and the electrode portion, and
wherein the short-circuit-preventing portion has a line width narrower than at least one of the contact portion and the electrode portion.

2. A light emitting device, comprising:
a substrate including an emission area and a non-emission area, wherein the substrate comprises a compound in which a silicon (Si) atom is chemically bonded to a metal atom selected from the group consisting of titanium (Ti), zirconium (Zr), hafnium (Hf), zinc (Zn), tellurium (Te) and combination thereof;
a light emitting diode disposed over the substrate and including a first electrode, an emission layer and a second electrode;
an auxiliary electrode directly contacting the first electrode;
a buffer layer disposed between the substrate and the light emitting diode;

a light extraction layer disposed between the buffer layer and the substrate; and a bank layer disposed on the first electrode and defining the emission area of the emission layer, wherein the auxiliary electrode is extended along the bank layer, wherein the first electrode includes a contact portion directly contacting the auxiliary electrode, an electrode portion disposed in the emission area and a short-circuit-preventing portion disposed between the contact portion and the electrode portion.

3. The light emitting device of claim 2, wherein the bank layer covers an upper surface and a side surface of each of the contact portion and the short-circuit-preventing portion, and covers a side surface of the electrode portion.

4. The light emitting device of claim 1, further comprising at least one pad disposed at the non-emission area.

5. The light emitting device of claim 1, wherein the buffer layer and the light extraction layer are disposed on an area corresponding to the emission area.

6. A light emitting device, comprising:
a substrate including an emission area and a non-emission area, wherein the substrate comprises a compound in which a silicon (Si) atom is chemically bonded to a metal atom selected from the group consisting of titanium (Ti), zirconium (Zr), hafnium (Hf), zinc (Zn), tellurium (Te) and combination thereof;
a light emitting diode disposed over the substrate and including a first electrode, an emission layer and a second electrode;
an auxiliary electrode directly contacting the first electrode;
a buffer layer disposed between the substrate and the light emitting diode; and
a light extraction layer disposed between the buffer layer and the substrate,
wherein the first electrode includes a contact portion directly contacting the auxiliary electrode, an electrode portion disposed in the emission area and a short-circuit-preventing portion disposed between the contact portion and the electrode portion, and
wherein the first electrode extends along an outer side of the buffer layer and the light extraction layer.

7. The light emitting device of claim 1, wherein the light extraction layer includes inorganic particles.

8. The A light emitting device, comprising:
a substrate including an emission area and a non-emission area, wherein the substrate comprises a compound in which a silicon (Si) atom is chemically bonded to a metal atom selected from the group consisting of titanium (Ti), zirconium (Zr), hafnium (Hf), zinc (Zn), tellurium (Te) and combination thereof;
a light emitting diode disposed over the substrate and including a first electrode, an emission layer and a second electrode;
an auxiliary electrode directly contacting the first electrode;
a buffer layer disposed between the substrate and the light emitting diode;
a light extraction layer disposed between the buffer layer and the substrate; and
a planarization layer disposed between the buffer layer and the light extraction layer,
wherein the first electrode includes a contact portion directly contacting the auxiliary electrode, an electrode portion disposed in the emission area and a short-circuit-preventing portion disposed between the contact portion and the electrode portion.

9. The light emitting device of claim 8, wherein the planarization layer includes an inorganic material selected from the group consisting of inorganic nitride, inorganic oxide, inorganic oxynitirde and combination thereof.

10. The light emitting device of claim 8, wherein the planarization layer includes an organic material selected from the group consisting of polyacrylate-based resin, polyimide-based resin and combination thereof.

11. The light emitting device of claim 1, wherein the silicon atom and the metal atom in the substrate is mixed with a molar ratio between about 7:3 and about 3:7.

12. The light emitting device of claim 1, wherein the substrate has a reflective index between about 1.7 and about 2.3.

13. The light emitting device of claim 1, wherein the metal atom includes titanium.

14. The light emitting device of claim 1, wherein the buffer layer includes at least one material of an inorganic material selected from the group consisting of silicon nitride (SixNy), silicon oxynitride (SixOyNz), silicon oxide (SixOy), zinc oxide (ZnO) and combination thereof and a photo-acrylic compound.

15. The light emitting device of claim 1, wherein the silicon atom and the metal atom are bonded through an oxane linkage (—O—).

16. The light emitting device of claim 1, wherein an interface between the substrate and the light extraction layer includes a curved surface.

17. A light emitting device, comprising:
an emission area and a non-emission area defined at a substrate, wherein the non-emission area includes a first non-emission area and a second non-emission area where a first pad and a second pad are respectively disposed;
a light emitting diode disposed over the substrate and including a first electrode, an emission layer and a second electrode;
an auxiliary electrode directly contacting the first electrode;
a buffer layer disposed between the substrate and the light emitting diode; and
a light extraction layer disposed between the buffer layer and the substrate,
wherein the first electrode includes a contact portion directly contacting the auxiliary electrode, an electrode portion disposed in the emission area and a short-circuit-preventing portion disposed between the contact portion and the electrode portion.

18. The light emitting device of claim 17, wherein the substrate comprises a compound including a silicon (Si) atom which is chemically bonded to a metal atom selected from the group consisting of titanium (Ti), zirconium (Zr), hafnium (Hf), zinc (Zn), tellurium (Te) and combination thereof.

19. The light emitting device of claim 17, wherein the first and second pads respectively are connected to the first electrode extend along an outer side of the buffer layer and the light extraction layer.

20. The light emitting device of claim 2, wherein the circuit-preventing portion has a line width narrower than at least one of the contact portion and the electrode portion.

21. The light emitting device of claim 6, wherein the circuit-preventing portion has a line width narrower than at least one of the contact portion and the electrode portion.

22. The light emitting device of claim 8, wherein the circuit-preventing portion has a line width narrower than at least one of the contact portion and the electrode portion.

* * * * *